US012188971B2

(12) United States Patent
Marlow et al.

(10) Patent No.: US 12,188,971 B2
(45) Date of Patent: Jan. 7, 2025

(54) RYDBERG ATOM-BASED VECTOR AND POLARIZATION SENSOR

(71) Applicant: The MITRE Corporation, McLean, VA (US)

(72) Inventors: Bonnie Lee Marlow, Ashburn, VA (US); Charles Thomas Fancher, Fairfax, VA (US)

(73) Assignee: The MITRE Corporation, McLean, VA (US)

( * ) Notice: Subject to any disclaimer, the term of this patent is extended or adjusted under 35 U.S.C. 154(b) by 272 days.

(21) Appl. No.: 17/964,692

(22) Filed: Oct. 12, 2022

(65) Prior Publication Data

US 2024/0125834 A1    Apr. 18, 2024

(51) Int. Cl.
*G01R 29/12*    (2006.01)

(52) U.S. Cl.
CPC .................................... *G01R 29/12* (2013.01)

(58) Field of Classification Search
CPC .................................................. G01R 29/12
USPC ........................................................ 324/427
See application file for complete search history.

(56) References Cited

U.S. PATENT DOCUMENTS

| | | | |
|---|---|---|---|
| 7,157,687 B1 * | 1/2007 | Yao | G02F 1/093 359/489.08 |
| 9,823,075 B2 * | 11/2017 | Yao | G01C 19/72 |
| 10,979,147 B2 | 4/2021 | Gordon et al. | |
| 11,002,777 B2 | 5/2021 | Salim et al. | |
| 11,165,505 B2 | 11/2021 | Gordon et al. | |
| 2001/0055154 A1 * | 12/2001 | Zhao | G02B 6/29302 359/489.09 |

FOREIGN PATENT DOCUMENTS

WO    2021/243260 A1    12/2021

OTHER PUBLICATIONS

Jing, Mingyong, et al. "Quantum superhet based on microwave-dressed Rydberg atoms." arXiv preprint arXiv:1902.11063 (2019). (Year: 2019).*
Prajapati, Nikunjkumar, and Irina Novikova. "Polarization-based truncated SU (1, 1) interferometer based on four-wave mixing in Rb vapor." arXiv preprint arXiv:1906.07213 (2019). (Year: 2019).*
Prajapati, Nikunj, and Irina Novikova. "Implementation of Polarization-Based Truncated SU (1, 1) Interferometer in Hot Rb Vapor." Optical, Opto-Atomic, and Entanglement-Enhanced Precision Metrology II. vol. 11296. SPIE, 2020. (Year: 2020).*

(Continued)

*Primary Examiner* — Christopher P McAndrew
(74) *Attorney, Agent, or Firm* — Morrison & Foerster LLP

(57) ABSTRACT

An electric field sensor may include an atomic vapor cell and a plurality of lasers configured to excite atoms in the vapor cell from a low-energy state to a high-energy state. The sensor may be configured to split signals from the plurality of lasers into multiple polarized signals. The polarized signals may be transmitted through the atomic vapor cell. A subset of the polarized signals may be received by photodetectors after the subset exits the vapor cell. Based on signals from the photodetectors, the electric field sensor may determine an angle of arrival and polarization information about an electric field that is incident upon the atomic vapor cell.

39 Claims, 8 Drawing Sheets

(56) References Cited

OTHER PUBLICATIONS

Kupchak, Connor, et al. "Room-temperature single-photon level memory for polarization states." Scientific reports 5.1 (2015): 7658. (Year: 2015).*

Fancher et al. (Apr. 2021). "Rydberg Atom Electric Field Sensors for Communications and Sensing" Quantum Sensing and Metrology IEEE Transaction on Quantum Engineering; vol. 2: 13 pages.

Robinson et al. (Jan. 2021), "Determining the Angle-of-Arrival of an Radio-Frequency Source with a Rydberg Atom-Based Sensor" (5 pages).

Simons et al. (Oct. 2019). "Embedding a Rydberg Atom-Based Sensor into an Antenna for Phase and Amplitude Detection of Radio-Frequency Fields and Modulated Signals" (10 pages).

* cited by examiner

RYDBERG ATOM-BASED VECTOR AND POLARIZATION SENSOR

FIELD OF THE DISCLOSURE

The present disclosure relates to systems and methods for detecting and extracting information about physical properties of electric fields.

BACKGROUND OF THE DISCLOSURE

Precise sensing of electric fields has many applications. For example, many technologies such as RF communications require or benefit from accurate and detailed information about nearby electric fields. Systems employing multi-photon transitions in atoms to detect electric fields are the subject of on-going research due to their high sensitivities and resilience to directed energy threats.

An exemplary system that harnesses multi-photon transitions in atoms to detect electric fields is the Rydberg atom electric field sensor. Atoms that have been excited to a high energy Rydberg state are highly sensitive to electric fields. This property of Rydberg atoms can be harnessed to create an electric field sensor that in many ways are superior to conventional electric field sensors. In addition to being highly accurate, these sensors have several desirable characteristics, including small physical size, broad frequency spectrum access, and broadband noise rejection and thus have potential applicability in fields such as communications, sensing, and metrology.

Determining information about specific properties of nearby electric fields, in addition to simply detecting the fields' presence, may be beneficial in a variety of applications. For example, with regard to communications technologies, the ability to verify the direction of arrival of an incident electric field may increase the resilience of communications devices against spoofing attacks. Similarly, again with regard to communications technologies, the ability to extract polarization information about an incident electric field may allow data to be encoded in polarized signals that may be transmitted between one or more devices.

Despite their capability to precisely and accurately determine the presence of incident electric fields, Rydberg atom electric field sensors are often incapable of determining additional field information without significant oversight or input from an experienced user. Extracting certain field property information such as wavevector or polarization information using a Rydberg atom electric field sensor often requires multiple measurements to be conducted, thus making the extraction impractical. Additionally, in many cases, determining a specific property of the electric field requires a Rydberg atom electric field sensor that has been specifically adapted to measure the property of interest. Using multiple, customized sensors to conduct more than one measurement is often time-consuming and cost-ineffective. Thus, despite their many desirable characteristics, Rydberg atom electric field sensors have limited applicability due to their restricted measurement abilities. What is needed is a solution for detecting multiple important electric field properties using a single Rydberg atom electric field sensing device.

SUMMARY OF THE DISCLOSURE

The present disclosure provides a Rydberg atom electric field sensor that is capable of detecting both angle of arrival and polarization information about incident electric fields during a single measurement session. In one or more examples, the sensor may be configured to generate a plurality of excitation regions within an atomic vapor cell. In one or more examples, atoms in each excitation region may be excited from a ground state to a high-energy Rydberg state by laser signals having a specific polarization. In one or more examples, the sensor may be configured to generate a pre-calibrated reference signal. When an external electric field is incident upon the sensor, the reactions of the excited atoms in each of the plurality of generated excitation regions in the atomic vapor cell may vary based on the direction of arrival and polarization of the external field. In one or more examples, the sensor can use data associated with the responses of the excited atoms in each region to determine an angle of arrival of an external electric field. In one or more examples, the sensor can use data associated with the responses of the excited atoms in each region to extract polarization information about the incident electric field.

In one or more examples, an electric field sensor may comprise: an atomic vapor cell configured to contain one or more atoms; a first laser, wherein the first laser generates a first laser signal configured to excite the one or more atoms in the atomic vapor cell from a first energy state to a second energy state, and wherein the second energy state is higher than the first energy state; a second laser, wherein the second laser generates a second laser signal configured to excite the one or more atoms in the in atomic vapor cell from the second energy state to a third state, and wherein the third energy state is higher than the second energy state; a first beam displacer, wherein the first beam displacer is configured to receive the first laser signal from the first laser, wherein the first beam displacer is configured to split the first laser signal into a first polarized signal and a second polarized signal, and wherein the first beam displacer is optically connected to the atomic vapor cell and is configured to transmit the first and second polarized signals to the atomic vapor cell; a second beam displacer, wherein the second beam displacer is configured to receive the second laser signal from the second laser, wherein the second beam displacer is configured to split the second laser into a third polarized and a fourth polarized signal, wherein the second beam displacer is optically connected to the atomic vapor cell and is configured to transmit the third and fourth polarized signals to the atomic vapor cell, wherein the first and third polarized signals are transmitted to the atomic vapor cell such that they counter-propagate in a first region of the atomic vapor cell, and wherein the second and fourth polarized signals are transmitted to the atomic vapor cell such that they counter-propagate in a second region of the atomic vapor cell; one or more photodetectors configured to receive the first and second polarized signals as they exit the atomic vapor cell; a memory; and one or more processors; wherein the memory stores one or more programs that when executed by the one or more processors, cause the one or more processors, when an electric field is incident upon the atomic vapor cell, to: determine an angle of arrival of the electric field based on one or more signals received from the one or more photodetectors; and determine polarization information associated with the electric field based on the one or more signals received from the one or more photodetectors.

In one or more examples of the electric field sensor, the one or more atoms comprise one or more rubidium atoms.

In one or more examples of the electric field sensor, the first polarized signal is polarized orthogonally to the second polarized signal.

In one or more examples of the electric field sensor, the third polarized signal is polarized orthogonally to the fourth polarized signal.

In one or more examples of the electric field sensor, the first polarized signal and the third polarized signal have the same polarization.

In one or more examples of the electric field sensor, the second polarized signal and the fourth polarized signal have the same polarization.

In one or more examples of the electric field sensor, the first laser signal has a wavelength greater than or equal to 750 nm and less than or equal to 800 nm.

In one or more examples of the electric field sensor, the second laser signal has a wavelength greater than or equal to 425 nm and less than or equal to 475 nm.

In one or more examples of the electric field sensor, the one or more photodetectors comprise one or more photodiodes.

In one or more examples of the electric field sensor, the sensor comprises an oscillator configured to transmit a reference signal to the atomic vapor cell, and wherein the reference signal is configured to propagate through the first region and the second region of the atomic vapor cell.

In one or more examples of the electric field sensor, determining the angle of arrival of the electric field comprises: determining a first relative phase between the first polarized signal and the reference signal; determining a second relative phase between second polarized signal and the reference signal; and determining a phase difference between the first relative phase and the second relative phase.

In one or more examples of the electric field sensor, determining the polarization information associated with the electric field comprises: determining an intensity of a first optical response of atoms in the first region of the atomic vapor cell due to the incident electric field; determining an intensity of a second optical response of atoms in the second region of the atomic vapor cell due to the incident electric field; comparing the intensity of a first optical response of atoms in the first region of the atomic vapor cell to the intensity of a second optical response of atoms in the second region of the atomic vapor cell; and determining a relative amplitude of a first polarization component and a second polarization component of the incident electric field based on the comparison between the intensity of the first optical response and the intensity of the second optical response.

In one or more examples of the electric field sensor, the first polarization component of the incident electric field is parallel to the first polarized signal and the second polarization component of the incident electric field is parallel to the second polarized signal.

In one or more examples, a method for detecting an electric field may comprise: generating, using a first laser, a first laser signal configured to excite one or more atoms in an atomic vapor cell from a first energy state to a second energy state, wherein the second energy state is higher than the first energy state; generating, using a second laser, a second laser signal configured to excite the one or more atoms in the in atomic vapor cell from the second energy state to a third state, wherein the third energy state is higher than the second energy state; using a first beam displacer, splitting the first laser signal into a first polarized signal and a second polarized signal; using a second beam displacer, splitting the second laser signal into a third polarized signal and a fourth polarized signal; transmitting the first polarized signal from the first beam displacer to the atomic vapor cell and the third polarized signal from the second beam displacer to the atomic vapor cell such that the first polarized signal and the third polarized signal counter-propagate in a first region of the atomic vapor cell; transmitting the second polarized signal from the first beam displacer to the atomic vapor cell and the fourth polarized signal from the second beam displacer to the atomic vapor cell such that the second polarized signal and the fourth polarized signal counter-propagate in a second region of the atomic vapor cell; receiving, at one or more photodetectors, the first and second polarized signals as they exit the atomic vapor cell; and when an electric field is incident upon the atomic vapor cell, using one or more processors to: determine an angle of arrival of the electric field based on one or more signals received from the one or more photodetectors; and determine polarization information associated with the electric field based on the one or more signals received from the one or more photodetectors.

In one or more examples of the method for detecting an electric field, the one or more atoms comprise one or more rubidium atoms.

In one or more examples of the method for detecting an electric field, the first polarized signal is polarized orthogonally to the second polarized signal.

In one or more examples of the method for detecting an electric field, the third polarized signal is polarized orthogonally to the fourth polarized signal.

In one or more examples of the method for detecting an electric field, the first polarized signal and the third polarized signal have the same polarization.

In one or more examples of the method for detecting an electric field, the second polarized signal and the fourth polarized signal have the same polarization.

In one or more examples of the method for detecting an electric field, the first laser signal has a wavelength greater than or equal to 750 nm and less than or equal to 800 nm.

In one or more examples of the method for detecting an electric field, the second laser signal has a wavelength greater than or equal to 425 nm and less than or equal to 475 nm.

In one or more examples of the method for detecting an electric field, the one or more photodetectors comprise one or more photodiodes.

In one or more examples of the method for detecting an electric field, the sensor comprises an oscillator configured to transmit a reference signal to the atomic vapor cell, and wherein the reference signal is configured to propagate through the first region and the second region of the atomic vapor cell.

In one or more examples of the method for detecting an electric field, determining the angle of arrival of the electric field comprises: determining a first relative phase between the first polarized signal and the reference signal; determining a second relative phase between second polarized signal and the reference signal; and determining a phase difference between the first relative phase and the second relative phase.

In one or more examples of the method for detecting an electric field, determining the polarization information associated with the electric field comprises: determining an intensity of a first optical response of atoms in the first region of the atomic vapor cell due to the incident electric field; determining an intensity of a second optical response of atoms in the second region of the atomic vapor cell due to the incident electric field; comparing the intensity of a first optical response of atoms in the first region of the atomic vapor cell to the intensity of a second optical response of atoms in the second region of the atomic vapor cell; and determining a relative amplitude of a first polarization component and a second polarization component of the incident electric field based on the comparison between the intensity of the first optical response and the intensity of the second optical response.

In one or more examples of the method for detecting an electric field, the first polarization component of the incident electric field is parallel to the first polarized signal and the second polarization component of the incident electric field is parallel to the second polarized signal.

In one or more examples, a non-transitory computer readable storage medium may store instructions for detecting an electric field that, when executed by one or more processors of an electronic device, cause the device to: generate, using a first laser, a first laser signal configured to excite one or more atoms in an atomic vapor cell from a first energy state to a second energy state, wherein the second energy state is higher than the first energy state; generate, using a second laser, a second laser signal configured to excite the one or more atoms in the in atomic vapor cell from the second energy state to a third state, wherein the third energy state is higher than the second energy state; using a first beam displacer, split the first laser signal into a first polarized signal and a second polarized signal; using a second beam displacer, split the second laser signal into a third polarized signal and a fourth polarized signal; transmit the first polarized signal from the first beam displacer to the atomic vapor cell and the third polarized signal from the second beam displacer to the atomic vapor cell such that the first polarized signal and the third polarized signal counter-propagate in a first region of the atomic vapor cell; transmit the second polarized signal from the first beam displacer to the atomic vapor cell and the fourth polarized signal from the second beam displacer to the atomic vapor cell such that the second polarized signal and the fourth polarized signal counter-propagate in a second region of the atomic vapor cell; receive, at one or more photodetectors, the first and second polarized signals as they exit the atomic vapor cell; and when an electric field is incident upon the atomic vapor cell: determine an angle of arrival of the electric field based on one or more signals received from the one or more photodetectors; and determine polarization information associated with the electric field based on the one or more signals received from the one or more photodetectors.

In one or more examples of the non-transitory computer readable storage medium, the one or more atoms comprise one or more rubidium atoms.

In one or more examples of the non-transitory computer readable storage medium, the first polarized signal is polarized orthogonally to the second polarized signal.

In one or more examples of the non-transitory computer readable storage medium, the third polarized signal is polarized orthogonally to the fourth polarized signal.

In one or more examples of the non-transitory computer readable storage medium, the first polarized signal and the third polarized signal have the same polarization.

In one or more examples of the non-transitory computer readable storage medium, the second polarized signal and the fourth polarized signal have the same polarization.

In one or more examples of the non-transitory computer readable storage medium, the first laser signal has a wavelength greater than or equal to 750 nm and less than or equal to 800 nm.

In one or more examples of the non-transitory computer readable storage medium, the second laser signal has a wavelength greater than or equal to 425 nm and less than or equal to 475 nm.

In one or more examples of the non-transitory computer readable storage medium, the one or more photodetectors comprise one or more photodiodes.

In one or more examples of the non-transitory computer readable storage medium, the sensor comprises an oscillator configured to transmit a reference signal to the atomic vapor cell, and wherein the reference signal is configured to propagate through the first region and the second region of the atomic vapor cell.

In one or more examples of the non-transitory computer readable storage medium, determining the angle of arrival of the electric field comprises: determining a first relative phase between the first polarized signal and the reference signal; determining a second relative phase between second polarized signal and the reference signal; and determining a phase difference between the first relative phase and the second relative phase.

In one or more examples of the non-transitory computer readable storage medium, determining the polarization information associated with the electric field comprises: determining an intensity of a first optical response of atoms in the first region of the atomic vapor cell due to the incident electric field; determining an intensity of a second optical response of atoms in the second region of the atomic vapor cell due to the incident electric field; comparing the intensity of a first optical response of atoms in the first region of the atomic vapor cell to the intensity of a second optical response of atoms in the second region of the atomic vapor cell; and determining a relative amplitude of a first polarization component and a second polarization component of the incident electric field based on the comparison between the intensity of the first optical response and the intensity of the second optical response.

In one or more examples of the non-transitory computer readable storage medium, the first polarization component of the incident electric field is parallel to the first polarized signal and the second polarization component of the incident electric field is parallel to the second polarized signal.

BRIEF DESCRIPTION OF THE FIGURES

The invention will now be described, by way of example only, with reference to the accompanying drawings, in which.

DETAILED DESCRIPTION OF THE DISCLOSURE

Figure 1B:
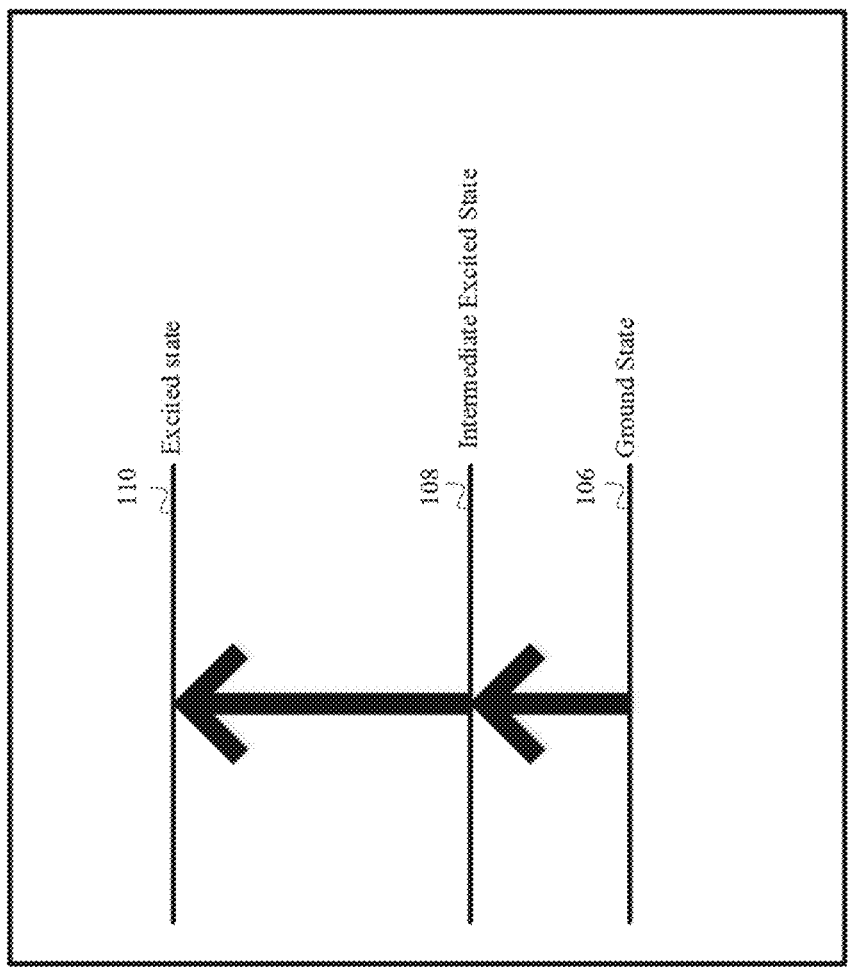
FIG. 1B illustrates an exemplary Rydberg energy level diagram according to examples of the present disclosure.

Atoms that have been excited to a high energy state may be extremely sensitive to changes in the electromagnetic field(s) in the surrounding environment. Rydberg atom electric field sensors harness this property of atoms in order to detect the presence of electric fields. However, many applications may require or benefit from the ability to efficiently collect information about specific properties (e.g., directions of propagation and polarizations) of nearby electric fields.

Accordingly, the present disclosure provides a Rydberg atom electric field sensor that can detect both vector and polarization information about incident electric fields during a single measurement session. The sensor described herein may have applications in a variety of fields. The ability to efficiently extract polarization information associated with incident electric fields, for instance, may allow for the encoding and wireless transmission of data in polarized electromagnetic signals. The ability to precisely determine vector (i.e., direction of propagation) information associated with incident electric fields may be used to strengthen the security of wireless communication devices by providing said devices with a tool to verify whether received signals are arriving from an expected direction. More generally, the sensors described herein can increase users' situational awareness of nearby electromagnetic fields and effectively allow users to "map" their local electromagnetic environment.

In the following description of the various embodiments, it is to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes, "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Certain aspects of the present disclosure include process steps and instructions described herein in the form of an algorithm. It should be noted that the process steps and instructions of the present disclosure could be embodied in software, firmware, or hardware and, when embodied in software, could be downloaded to reside on and be operated from different platforms used by a variety of operating systems. Unless specifically stated otherwise as apparent from the following discussion, it is appreciated that, throughout the description, discussions utilizing terms such as "processing," "computing," "calculating," "determining," "displaying," "generating" or the like, refer to the action and processes of a computer system, or similar electronic computing device, that manipulates and transforms data represented as physical (electronic) quantities within the computer system memories or registers or other such information storage, transmission, or display devices.

The present disclosure in one or more examples also relates to a device for performing the operations herein. This device may be specially constructed for the required purposes, or it may comprise a general purpose computer selectively activated or reconfigured by a computer program stored in the computer. Such a computer program may be stored in a non-transitory, computer readable storage medium, such as, but not limited to, any type of disk, including floppy disks, USB flash drives, external hard drives, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each connected to a computer system bus. Furthermore, the computing systems referred to in the specification may include a single processor or may be architectures employing multiple processor designs, such as for performing different functions or for increased computing capability. Suitable processors include central processing units (CPUs), graphical processing units (GPUs), field programmable gate arrays (FPGAs), and ASICs.

The methods, devices, and systems described herein are not inherently related to any particular computer or other apparatus. Various general-purpose systems may also be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the present disclosure as described herein.

Electric Field Detection Using Rydberg Atom Electric Field Sensors

In the absence of external energy, an atom will occupy its lowest-energy level, known as the ground state. If the atom absorbs energy, its energy level may increase to a higher energy excited state. A Rydberg atom is a large atom whose valence (i.e., outermost) electron(s) have been excited to a high energy (i.e., Rydberg) state. Among other interesting properties, Rydberg atoms display high sensitivity to electromagnetic fields. As such, in recent years, they have been used to develop small, highly accurate electric field sensors. Due to their size, accuracy, and insensitivity to noise, these sensors may be useful in a variety of areas. For example, Rydberg atom electric field sensors may be implemented in communications technologies to provide protection against electromagnetic pulses or in sensing technologies to improve the precision of radar or geolocation measurements.

Figure 1A:
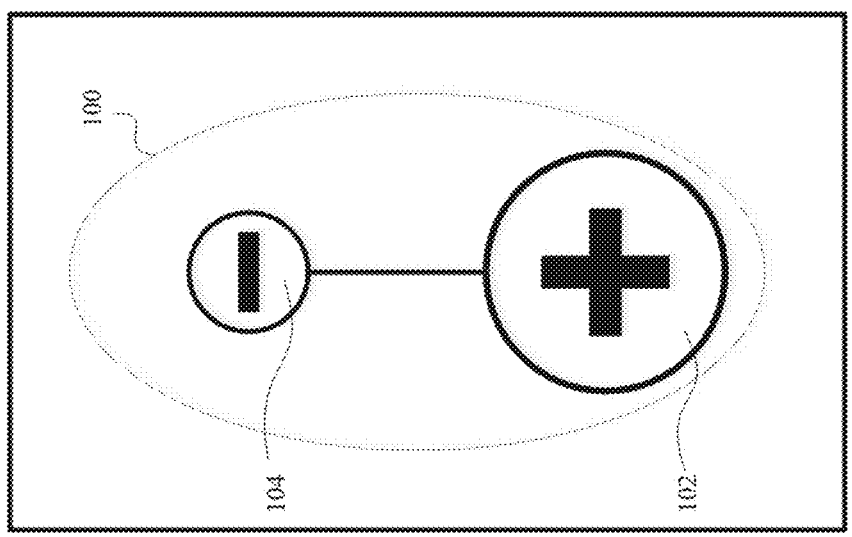
FIG. 1A illustrates exemplary properties of a Rydberg atom according to examples of the present disclosure.

FIG. 1A illustrates exemplary properties of a Rydberg atom according to examples of the disclosure. Specifically, FIG. 1A shows exemplary Rydberg atom 100. Rydberg atom 100 comprises a positive core 102, which can include the atom's nucleus and inner (non-valence) electrons, and an excited valence electron 104. As mentioned above, Rydberg atoms are large atoms; thus, in the Rydberg state, the radius of excited valence electron 104 orbit about positive core 102 can be wide. In one or more examples, this large orbital radius can cause the Rydberg atom to behave like an electric dipole (i.e., a positive charge and a negative charge separated by a distance). Like an electric dipole, whose energy may be perturbed in the presence of an external electric field, excited valence electron 104's energy levels can be perturbed in the presence of an external electric field. These perturbations can be detected by a laser and used to extract data about the electric field. This is the basic mechanism underlying atomic electric field sensors.

FIG. 1B illustrates an exemplary atomic energy level diagram for an exemplary atom (e.g., Rydberg atom 100 shown in FIG. 1A) according to examples of the disclosure. As illustrated in FIG. 1B, the atom can start in a ground state 106, wherein all of the atom's electrons are occupying their lowest-energy states. This is the lowest-energy state that the atom can occupy. In one or more examples, external energy (e.g., from a laser) can be applied to the atom to excite a valence electron to an intermediate excited state 108. In one or more examples, once the atom is in intermediate excited state 108, external energy (e.g., from a second laser) can be applied to excite the valence electron to a higher energy Rydberg state 110. Once the atom has been excited to the Rydberg state, it can be used to detect electric fields as described above.

In one or more examples, Rydberg atom electric field sensors may have one or more chambers filled with atoms (usually in a gaseous form) that can be excited to a Rydberg state using one or more lasers. In one or more examples, the one or more lasers are directed into the chamber, causing their light to impinge and impart energy on the atoms in the chamber, thereby exciting them to higher energy state. In one or more examples, exciting the atoms to a Rydberg state and then using the atoms to sense an electric field can require two separate lasers. In one or more examples, the first laser, called a probe laser, can excite the atoms in the chamber to an intermediate excited state. In one or more examples, the probe laser can also be used to detect energy perturbations in the atoms in the presence of external electric fields. In one or more examples, the second laser, called a control laser, can excite the atoms to a Rydberg state after the probe laser has excited them to an intermediate state. In one or more examples, tuning the frequency of the control laser can allow different Rydberg states to be achieved.

Figure 2:
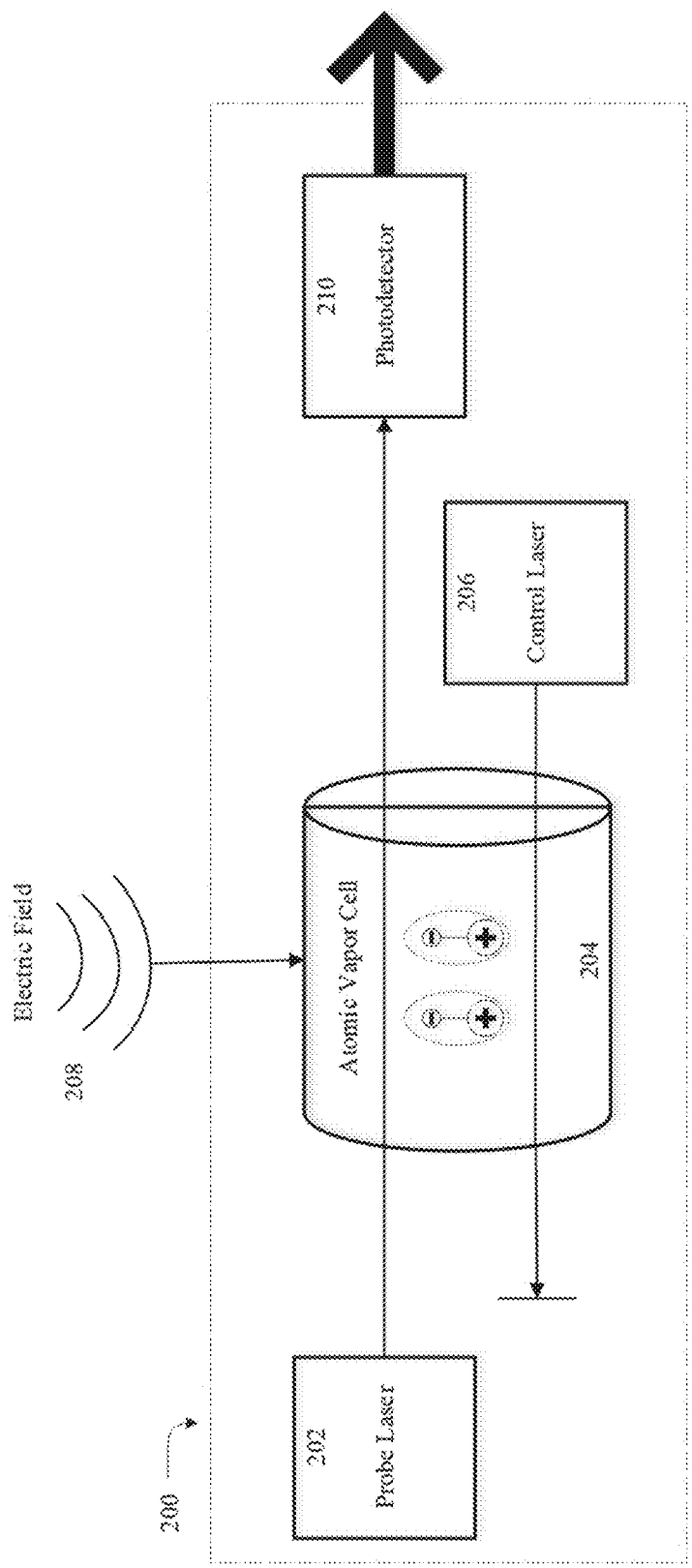
FIG. 2 illustrates an exemplary Rydberg atom electric field sensor according to examples of the present disclosure.

FIG. 2 illustrates an exemplary standard Rydberg atom electric field sensor according to examples of the disclosure. Specifically, FIG. 2 illustrates an exemplary standard sensor 200 for detecting an incident electric field 208 using the properties of Rydberg atoms described above. In one or more examples, sensor 200 can include a probe laser 202, an atomic vapor cell 204 (i.e., the chamber), a control laser 206, and a photodetector 210. In one or more examples, sensor 200 may comprise additional electronic components familiar to those skilled in the art. For example, sensor 200 may comprise one or more electronic components configured to support the laser systems (e.g., laser frequency locking controls or components configured to perform saturated absorption spectroscopy).

In one or more examples, atomic vapor cell 204 comprises atoms which can be excited to a Rydberg state. In one or more examples, probe laser 202 can be configured to direct laser light to atomic vapor cell 204 so as to excite the atoms to an intermediate exited state. In one or more examples, once the atoms have been excited to the intermediate state, control laser 206 can be applied to atomic vapor cell 204 to excite the atoms to a chosen Rydberg state (based on the frequency of the laser). In one or more examples, in order to excite the atoms in atomic vapor cell 204 to a Rydberg state, the light from control laser 206 may be applied to atomic vapor cell 204 such that it overlaps or counter-propagates with the light from probe laser 202 that is applied to atomic vapor cell 204. In one or more examples, the Rydberg state can be chosen by tuning the frequency of the control laser. In one or more examples, if sensor 200 is placed in an external electric field 208, the energy levels of the Rydberg atoms in atomic vapor cell 204 can shift due to the external electric field. In one or more examples, these shifts can perturb the frequency of the light from probe laser 202 and control laser 206. In one or more examples, these shifts can be used to detect properties of incident electric field 208. In one or more examples, photodetector 210 may be situated such that the perturbed light from probe laser 202 is detected as it exits vapor cell 204. In one or more examples, photodetector 210 can be configured to specifically detect light at or approximately at the wavelength the probe laser 202. In one or more examples, spectral analysis of data from photodetector 210 can provide information about electric field 208.

Angle of Arrival and Polarization of Electric Fields

As described above, the present disclosure provides a Rydberg atom electric field sensor that can simultaneously extract vector and polarization information associated with detected electric fields. In one or more examples, extracting vector information associated with an incident electric field may comprise determining angle of arrival information.

Figure 3A:
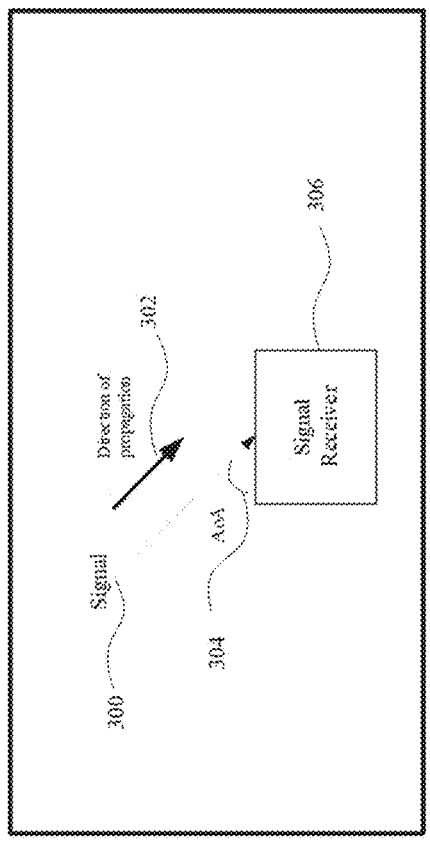
FIG. 3A illustrates the angle of arrival of an exemplary signal at an exemplary signal receiver according to examples of the present disclosure.

FIG. 3A illustrates the angle of arrival (AoA) of an exemplary electric field signal at an exemplary signal receiver according to examples of the present disclosure. As shown, exemplary electric field signal 300 propagates in a propagation direction 302 toward a signal receiver 306. Signal 300 intercepts signal receiver 306 at an angle 304 with respect to signal receiver 306. The angle 304 at which signal 300 is received is known as the "angle of arrival" of signal 300 at receiver 306.

Figure 3B:
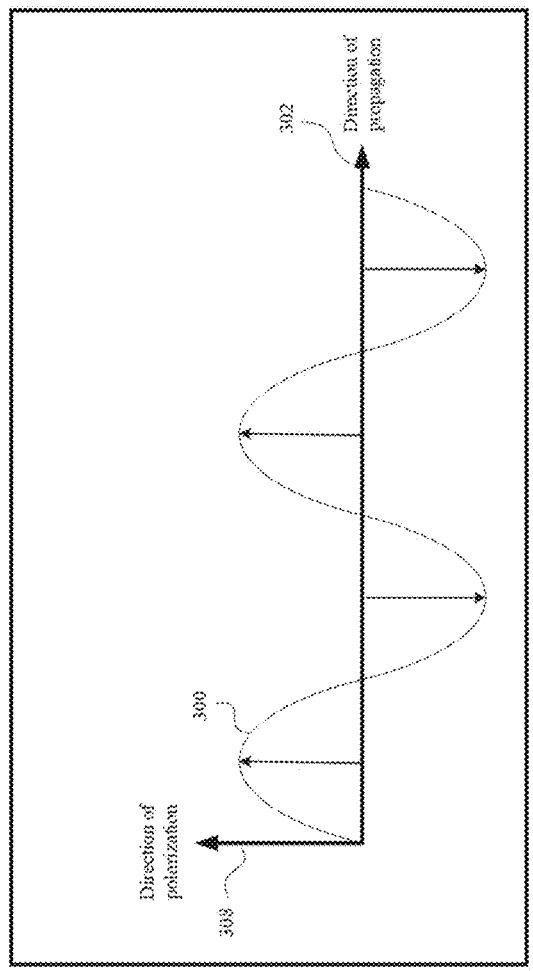
FIG. 3B illustrates the polarization of an exemplary signal according to examples of the present disclosure.

FIG. 3B illustrates the polarization of an exemplary electric field signal according to examples of the present disclosure. Specifically, FIG. 3B illustrates an exemplary electric field signal 300 that is propagating in a direction 302. In one or more examples, signal 300 may oscillate in a direction 308. The direction of oscillation of signal 300 is the "polarization" of signal 300. Polarization can refer to the geometrical orientation of the oscillations of a wave. Thus, in the context of an electrical field of signal 300, the polarization of signal 300 can refer to the geometrical orientation of the oscillation of the electrical field.

Electric Field Sensor for Determining Vector and Polarization Information

Rydberg atom electric field sensors such as sensor 300 shown in FIG. 3 may be highly sensitive to the presence of external electric fields, but may not be capable of extracting information about the properties of the electric fields they detect. In one or more examples, the present disclosure provides a Rydberg atom electric field sensor that can determine vector and polarization information associated with the electric fields it detects. Such a sensor may detect the presence of incident electric fields and may additionally be configured to generate a plurality of excitation regions within an atomic vapor cell. In one or more examples, atoms in each excitation region may be excited from a ground state to a high-energy Rydberg state by laser signals having a specific polarization. In one or more examples, the sensor may be configured to generate a pre-calibrated reference signal. When an external electric field is incident upon the sensor, the reactions of the excited atoms in each of the plurality of generated excitation regions in the atomic vapor cell may vary based on the direction of arrival and polarization of the external field. In one or more examples, the sensor can use data associated with the responses of the excited atoms in each region to determine an angle of arrival of an external electric field. In one or more examples, the sensor can use data associated with the responses of the excited atoms in each region to extract polarization information about the incident electric field.

Sensor Components and Structure

Figure 4:
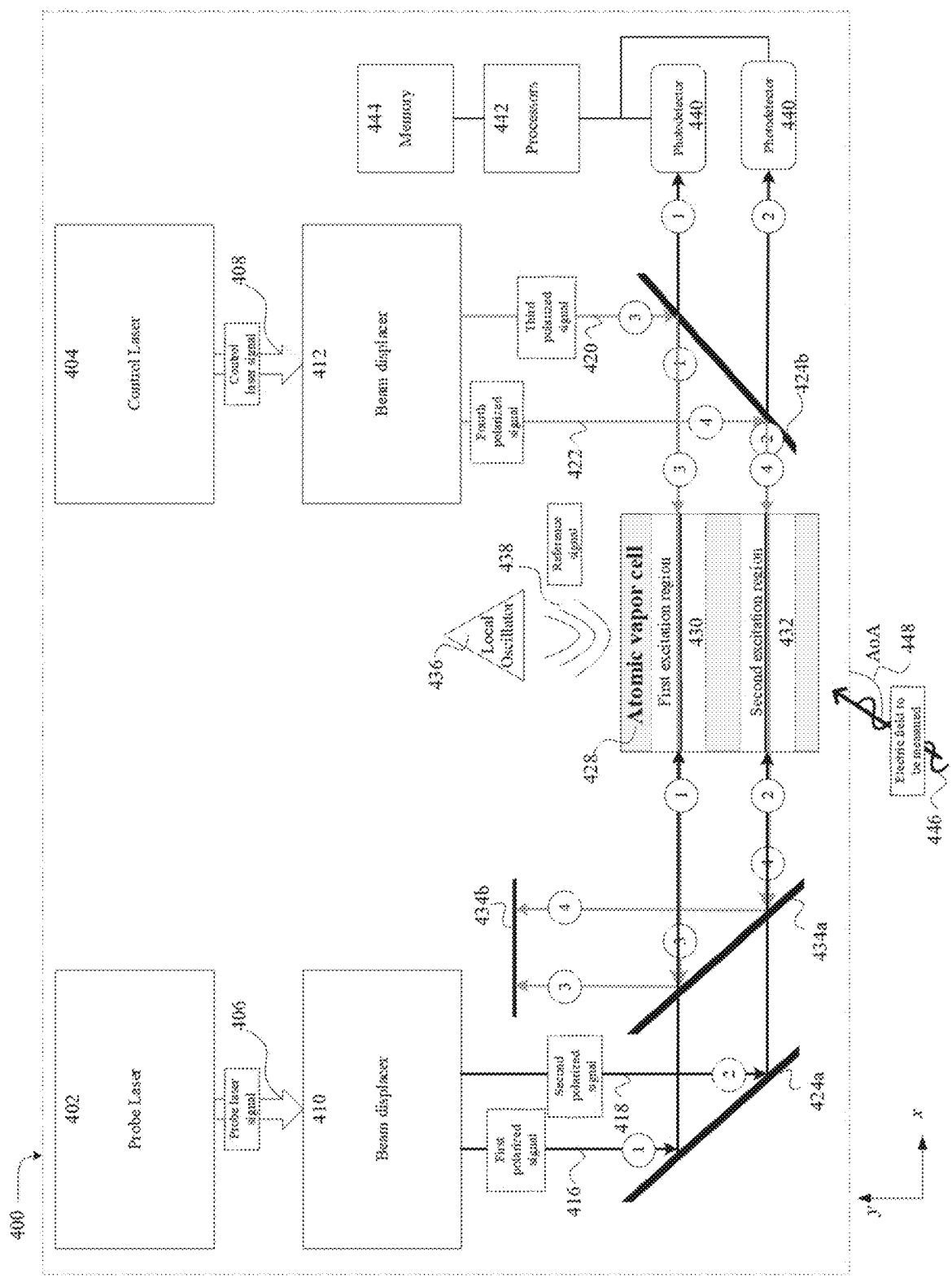
FIG. 4 illustrates an exemplary Rydberg atom electric field sensor for determining vector and polarization information according to examples of the present disclosure.

FIG. 4 illustrates an exemplary Rydberg atom electric field sensor for determining vector and polarization information according to examples of the present disclosure. Specifically, FIG. 4 illustrates an exemplary sensor 400 for detecting and determining vector and polarization information of an incident electric field 446. In one or more examples, the vector and polarization information that sensor 400 determines about incident electric field 446 may comprise an angle of arrival 448 of electric field 446 with respect to a plane. In one or more examples, the vector and polarization information that sensor 400 determines may include information about the polarization of electric field 446 with respect to one or more predefined polarization directions.

Like sensor 300 shown in FIG. 3, sensor 400 may comprise a probe laser 402, a control laser 404, and an atomic vapor cell 428. In one or more examples, atomic vapor cell 428 may be configured to contain one or more atoms that can be excited to a high-energy Rydberg state. As previously discussed, exciting atoms to a Rydberg state from a low-energy ground state may require the atoms to first be excited from the ground state to an intermediate energy state that is higher than the ground state and then from the intermediate energy state to the Rydberg state. In one or more examples, probe laser 402 can generate a probe laser signal 406. Probe laser signal 406 may be configured to excite the one or more atoms from a first low-energy state, to a second intermediate-energy state that is higher than the first energy state. In one or more examples, control laser 404 may be configured to generate a control laser signal 408. Control laser signal 408 may be configured to excite the one or more atoms from the second intermediate-energy state, to a third high-energy state (e.g., a Rydberg energy state).

As discussed above with respect to FIGS. 2A-2B, Rydberg atoms (i.e., atoms that can be excited to a Rydberg state) may have large atomic radii. In one or more examples, atomic vapor cell 428 may be configured to house atoms having large atomic radii. In one or more examples, atomic vapor cell 428 may be configured to house atoms having atomic radii greater than or equal to 300, 310, 320, 330, 340, or 350 μm. In one or more examples, atomic vapor cell 428 may be configured to house one or more rubidium atoms. In one or more examples, atomic vapor cell 428 may be configured to contain one or more atoms in a gaseous state (e.g., a rubidium gas).

In one or more examples, probe laser signal 406 generated by probe laser 402 may carry an amount of energy equal to the difference between the energy level of the low-energy state of the one or more atoms housed in atomic vapor cell 428 and the energy level of the intermediate-energy state of the one or more atoms housed in atomic vapor cell 428. The amount of energy carried by a laser signal is inversely proportional to the wavelength of the laser signal. In one or more examples, the wavelength of probe laser signal 406 may be greater than or equal to 500, 550, 600, 650, 700, 750, or 800 nm. In one or more examples, the wavelength of probe laser signal 406 may be less than or equal to 500, 550, 600, 650, 700, 750, or 800 nm. In one or more examples, the wavelength of probe laser signal 406 may be between about 500-550, about 550-600, about 600-650, about 650-700, about 700-750, or about 750-800 nm.

In one or more examples, probe laser signal 406 may be configured to excite rubidium atoms from a low-energy state to an intermediate-energy state. Accordingly, in one or more examples, the wavelength of probe laser signal 406 may be approximately 770, 775, 780, 785, or 790 nm.

In one or more examples, control laser signal 408 generated by control laser 404 may carry an amount of energy equal to the difference between the energy level of the intermediate-energy state of the one or more atoms housed in atomic vapor cell 428 and the energy level of the high-energy Rydberg state of the one or more atoms housed in atomic vapor cell 428. As mentioned above, the amount of energy carried by a laser signal is inversely proportional to the wavelength of the laser signal. In one or more examples, the wavelength of control laser signal 408 may be greater than or equal to 300, 350, 400, 450, 500, 550, or 600 nm. In one or more examples, the wavelength of control laser signal 408 may be less than or equal to 300, 350, 400, 450, 500, 550, or 600 nm. In one or more examples, the wavelength of control laser signal 408 may be between about 300-350, about 350-400, about 400-450, about 425-475, about 475-500, about 500-550, or about 550-600 nm.

In one or more examples, control laser signal 408 may be configured to excite rubidium atoms from an intermediate-energy state to a high-energy Rydberg state. Accordingly, in one or more examples, the wavelength of control laser signal 408 may be approximately 470, 475, 480, 485, or 490 nm. In one or more examples, in order to obtain information about the angle-of-arrival or polarization of incident electric field 446, it may be necessary to generate multiple distinct excitation regions within atomic vapor cell 428. In one or more examples, an excitation region can refer to a dedicated physical space within the atomic vapor cell in which the atoms located in the region are excited using lasers with a known polarization. The multiple distinct excitation regions generated within atomic vapor cell 428 may be spatially separated. In one or more examples, each excitation region may be associated with a specific, known polarization. As described below, information about components of electric field 446's polarization to be extracted.

In one or more examples, creating the aforementioned multiple excitation regions within atomic vapor cell 428 may involve generating a plurality of signals having known polarizations using probe laser signal 406 and control laser signal 408 and directing these generated signals through atomic vapor cell 428 at multiple spatial locations. When initially emitted by probe laser 402 and control laser 404, probe laser signal 406 and control laser signal 408 may comprise a mixture of polarizations. In one or more examples, sensor 400 may comprise a first beam displacer 410 and a second beam displacer 412, each of which may be configured to receive a signal having a mixed polarization and, using the received signal, generate parallel signals having known polarizations. In one or more examples, one or more of first beam displacer 410 and second beam displacer 412 may comprise a polarizing beam splitter and one or more mirrors configured to control the directions of the generated polarized signals. In one or more examples, one or more of first beam displacer 410 and second beam displacer 412 may be calcite beam displacers.

In one or more examples, first beam displacer 410 and/or second beam displacer 412 may be substituted with alternative optical components configured to achieve the same effect as beam displacers, i.e., configured to receive a signal comprising a mixture of polarizations and output a signal having a known polarization. For instance, first beam displacer 410 and/or second beam displacer 412 may be substituted with a half-wave plate followed by a polarizing beam splitter.

In one or more examples, first beam displacer 410 may be positioned in an optical path of probe laser 402 so that first beam displacer 410 receives probe laser signal 406 when probe laser signal 406 is emitted by probe laser 402. In one or more examples, first beam displacer 410 may be configured to split the received probe laser signal 406 into a first polarized signal 416 and a second polarized signal 418. Similarly, in one or more examples, second beam displacer 412 may be positioned in an optical path of control laser 404 so that second beam displacer 412 receives control laser signal 408 when control laser signal 408 is emitted by control laser 404. In one or more examples, second beam displacer 412 may be configured to split the received control laser signal 408 into a third polarized signal 420 and a fourth polarized signal 422. Note that the exemplary optical paths of first polarized signal 416, second polarized signal 418, third polarized signal 420, and fourth polarized signal 422 shown in FIG. 4 are labeled throughout FIG. 4 with the numbers 1, 2, 3, and 4, respectively.

First beam displacer 410 and second beam displacer 412 may both be optically connected to atomic vapor cell 428. In one or more examples, first beam displacer 410 may be configured to transmit first polarized signal 416 and second polarized signal 418 to atomic vapor cell 428. Likewise, in one or more examples, second beam displacer 412 may be configured to transmit third polarized signal 420 and fourth polarized signal 422 to atomic vapor cell 428. In one or more examples, when received by atomic vapor cell 428, first polarized signal 416, second polarized signal 418, third polarized signal 420, and fourth polarized signal 422 may propagate through atomic vapor cell 428, imparting energy on the one or more atoms housed by atomic vapor cell 428 in the process.

In one or more examples, first beam displacer 410 and second beam displacer 412 may be configured to respectively transmit first polarized signal 416 and third polarized signal 420 to atomic vapor cell 428 such that first polarized signal 416 and third polarized signal 420 counter-propagate (i.e., propagate in exactly opposite directions) through a first excitation region 430 of atomic vapor cell 428. In one or more examples, as first polarized signal 416 and third polarized signal 420 counter-propagate through first excitation region 430, one or more atoms in first excitation region 430 may be excited from a low-energy state to an intermediate-energy state (by the energy imparted by first polarized signal 416, which originated from probe laser signal 406) and subsequently from the intermediate energy state to a high-energy Rydberg state (by the energy imparted by third polarized signal 420, which originated from control laser signal 408). Similarly, in one or more examples, first beam displacer 410 and second beam displacer 412 may be configured to respectively transmit second polarized signal 418 and fourth polarized signal 422 to atomic vapor cell 428 such that second polarized signal 418 and fourth polarized signal 422 counter-propagate (i.e., propagate in exactly opposite directions) through a second excitation region 432 of atomic vapor cell 428. In one or more examples, as second polarized signal 418 and fourth polarized signal 422 counter-propagate through second excitation region 432, one or more atoms in second excitation region 432 may be excited from a low-energy state to an intermediate-energy state (by the energy imparted by second polarized signal 418, which originated from probe laser signal 406) and subsequently from the intermediate energy state to a high-energy Rydberg state (by the energy imparted by fourth polarized signal 422, which originated from control laser signal 408).

In one or more examples, one or more of first polarized signal 416, second polarized signal 418, third polarized signal 420, and fourth polarized signal 422 may be linearly polarized at any angle with respect to the signal's direction of propagation. In one or more examples, first polarized signal 416 may be polarized in a different direction than second polarized signal 418. In one or more examples, first polarized signal 416 may be polarized orthogonally to second polarized signal 418. In one or more examples, third polarized signal 420 may be polarized in a different direction than fourth polarized signal 422. In one or more examples, third polarized signal 420 may be polarized orthogonally to fourth polarized signal 422.

In one or more examples, first polarized signal 416 and third polarized signal 420 may have the same polarization. Thus, first excitation region 430 may be associated with the polarization of first polarized signal 416 and third polarized signal 420. Likewise, in one or more examples, second polarized signal 418 and fourth polarized signal 422 may have the same polarization. As a result, second excitation region 432 may be associated with the polarization of second polarized signal 418 and fourth polarized signal 422.

In one or more examples, after propagating through atomic vapor cell 428, the laser signals that originated from control laser 404 (i.e., third laser signal 420 and fourth laser signal 422) may be transmitted away from atomic vapor cell 428.

In one or more examples, sensor 400 may comprise one or more optical components 424a, 424b, 434a, and 434b configured to control the optical paths of first polarized signal 416, second polarized signal 418, third polarized signal 420, and fourth polarized signal 422. In one or more examples, component 424a may be a mirror that is configured to reflect first polarized signal 416 and second polarized signal 418 into atomic vapor cell 428 after first polarized signal 416 and second polarized signal 418 are exit beam displacer 410. In one or more examples, component 424b and/or 434a may be filters that are configured to allow first polarized signal 416 and second polarized signal 418 to pass. Components 424b and 434a may be configured to block signals with frequencies that differ from the frequencies of first polarized signal 416 and second polarized signal 418. In one or more examples component 434b may be a beam block configured to absorb third polarized signal 420 and fourth polarized signal 422 after they exit vapor cell 428.

Extracting vector and polarization information about electric field 446 may comprise comparing data associated with the optical responses of atoms in first excitation region 430 and second excitation region 432 in the presence of electric field 446 to pre-calibrated data associated with a known signal. In one or more examples, sensor 400 may comprise a local oscillator 436 configured to generate a reference signal 438. Local oscillator 436 may be configured to transmit the generated reference signal 438 to atomic vapor cell 428. The reference signal may be configured to propagate through first excitation region 430 and second excitation region 432. In one or more examples, local oscillator may comprise a microwave source and an antenna. In one or more examples, reference signal 438 may comprise an electromagnetic wave. In one or more examples, reference signal 438 may comprise an electromagnetic wave with a polarization component that is parallel to first polarized signal 416 and a second polarization component that is parallel to second polarized signal 418. In one or more examples, reference signal 438 may comprise an electromagnetic wave with a polarization that is parallel to first polarized signal 416 and orthogonal to second polarized signal 418.

In one or more examples, the specific optical behavior of atoms excited to the Rydberg state in first excitation region 430 and the specific optical behavior of atoms excited to the Rydberg state in second excitation region 432 may, in the presence of incident electric field 446, be measurably distinct from one another. In one or more examples, the optical behavior of atoms in first excitation region 430 and the optical behavior of atoms in second excitation region 432 may depend on the polarization and direction of arrival of electric field 446. The optical behavior of atoms in each excitation region may induce perturbations in first polarized signal 416 and second polarized signal 418 as they propagate through their respective excitation regions. In one or more examples, information associated with the optical behavior of atoms in each excitation region may be extracted by measuring the induced perturbations.

In one or more examples, sensor 400 may comprise one or more photodetectors 440 configured to receive first polarized signal 416 and second polarized signal 418 as they exit atomic vapor cell 428 and generate one or more electrical signals. Specifically, in one or more examples, photodetectors 440 may use light carried by first polarized signal 416 and second polarized signal 418 to generate one or more electrical signals comprising data associated with optical responses of atoms in first excitation region 430 and optical responses of atoms in second excitation region 432. In one or more examples, photodetectors 440 may comprise one or more photodiodes.

In one or more examples, sensor 400 may comprise one or more processors 442 and a memory 444. In one or more examples, processors 442 may be connected to probe laser 402 and/or control laser 404 in order to provide feedback control, e.g., to ensure that the lasers are emitting signals at the appropriate frequencies. In one or more examples, processors 442 may be configured to receive the one or more signals generated by photodetectors 440. Memory 444 may store one or more programs configured to be executed by processors 442 to cause processors 444 to extract vector and polarization information associated with electric field 446 using the one or more signals received from photodetectors 440.

As electric field 446 propagates through atomic vapor cell 428, it may induce a phase shift in one or more of first polarized signal 416 and second polarized signal 418 relative to reference signal 438 that depends on angle of arrival 448. In one or more examples, the one or more programs stored in memory 444 may be configured to cause processors 442 to determine an angle of arrival 448 of electric field 446. In one or more examples, angle of arrival 448 may be an angle in a particular plane. In one or more examples, processors 442 may be configured to determine a relative phase between first polarized signal 416 and reference signal 438 based on the one or more signals received from photodetectors 440. Similarly, in one or more examples, processors 442 may be configured to determine a relative phase between second polarized signal 418 and reference signal 438 based on the one or more signals received from photodetectors 440. Processors 442 may then determine a phase difference between the relative phase $\phi_{430}$ of first polarized signal 416 and reference signal 438 and the relative phase $\phi_{432}$ of second polarized signal 418 and reference signal 438. In one or more examples, this phase difference may be related to angle of arrival 448 as follows:

$$\theta_{448} = \sin^{-1}\left(\frac{\phi_{432} - \phi_{431}}{kd}\right),$$

where $\phi_{448}$ is the angle of arrival of electric field 446, d is the distance between excitation region 430 and excitation region 432, and $k=2\pi/\lambda$, where $\lambda$ is the wavelength of the electric field 446.

In one or more examples, sensor 400 may comprise additional sets of dual sensing regions aligned orthogonally to first excitation region 430 and second excitation region 432. This may allow for the angle of arrival of electric field 446 to be determined with respect to several orthogonal planes, thereby allowing sensor 400 to determine a three-dimensional direction-of-arrival of electric field 446.

As explained above, in one or more examples atoms in first excitation region 430 may be excited to the Rydberg state by first polarized signal 416 and third polarized signal 420, which may have parallel polarizations. Similarly, in one or more examples atoms in second excitation region 432 may be excited to the Rydberg state by second polarized signal 418 and fourth polarized signal 422, which may have parallel polarizations that are in a different direction than the polarizations first polarized signal 416 and third polarized signal 420. In one or more examples, electric field 446 may comprise a first polarization component that is parallel to first polarized signal 416/third polarized signal 420 and a second polarization component that is parallel to second polarized signal 418/fourth polarized signal 422. In one or more examples, as electric field 446 propagates through atomic vapor cell 428, atoms in each excitation region may respond more strongly to the component of electric field 446 that is parallel to the polarization corresponding to the excitation region. For example, atoms in first excitation region 430 may have a stronger optical response to the first polarization component of electric field 446, since the atoms in first excitation region 430 may be excited by first polarized signal 416/third polarized signal 420, which may have polarizations parallel to first polarized signal 416/third polarized signal 420.

In one or more examples, the one or more programs stored in memory 444 may be configured to cause processors 442 to determine polarization information associated with electric field 446 based on the one or more signals received from photodetectors 440. In one or more examples, determining the polarization information may comprise determining an intensity of an optical response of atoms in first excitation region 430 due to the propagation of electric field 446 through first excitation region 430. In one or more examples, determining the polarization information may comprise determining an intensity of an optical response of atoms in second excitation region 432 due to the propagation of electric field 446 through second excitation region 432. Processors 442 may then compare the intensity of the optical responses in each region and, based on that comparison, determine a relative amplitude of the first polarization component (that is parallel to first polarized signal 416/third polarized signal 420) and the second polarization component (that is parallel to second polarized signal 418/fourth polarized signal 422) of electric field 446. In one or more examples, the relative amplitude of the first polarization component and the second polarization component may depend upon one or more parameters including frequency detunings and optical loss. In one or more examples, the normalized transmission of the probe field through the atoms $T_p$, where transmission is defined as the ratio of output power to input power, may be related to the strength of the electric field component whose polarization is parallel to the optical fields ($E_\parallel$) and the total electric field strength $|\vec{E}|$ by $T_p = 1 - (E_\parallel / |\vec{E}|)^2$.

Methods

Figure 5:
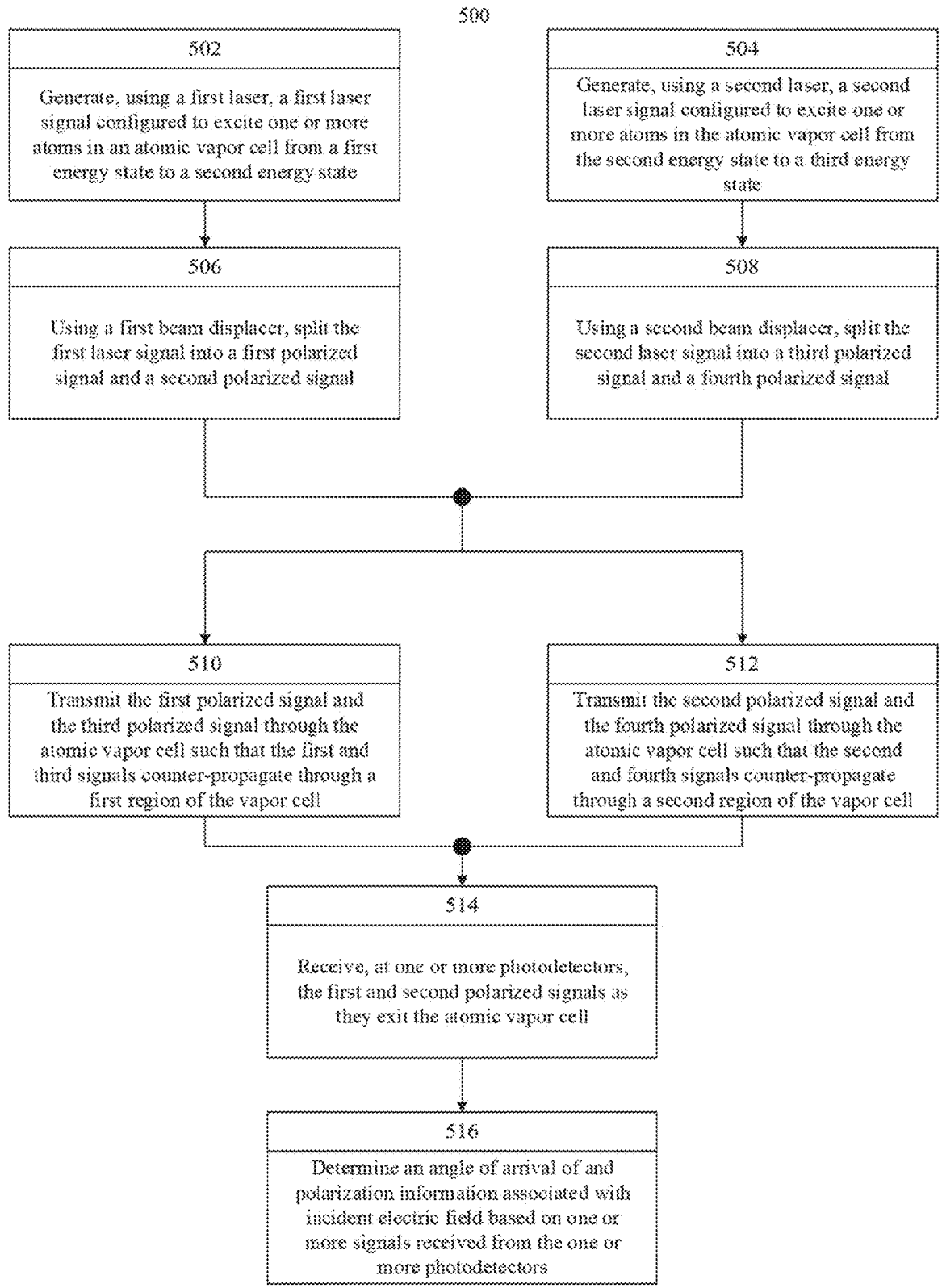
FIG. 5 illustrates an exemplary method for determining vector and polarization information associated with an electric field using a Rydberg atom electric field sensor for determining vector and polarization information according to examples of the present disclosure.

FIG. 5 illustrates an exemplary method for determining vector and polarization information associated with an electric field. Specifically, FIG. 5 shows a method 500 for determining an angle of arrival and a relative amplitude between polarization components of an electric field. In one or more examples, one or more steps of method 500 may be executed by one or more components of a Rydberg atom electric field sensor such as sensor 400 shown in FIG. 4.

In one or more examples, method 500 may comprise a step 502, which may comprise generating, using a first laser, a first laser signal that is configured to excite one or more atoms in an atomic vapor cell from a first energy state to a second energy state. In one or more examples, the first laser may have one or more features of probe laser 402 shown in FIG. 4. In one or more examples, the first laser signal generated by the first laser may have one or more features of probe laser signal 406 shown in FIG. 4. In one or more examples, the atomic vapor cell may include one or more features of atomic vapor cell 428 shown in FIG. 4. In one or more examples, the one or more atoms contained in the atomic vapor cell may comprise Rydberg atoms such as rubidium. In one or more examples, the first energy state may be a ground state of the one or more atoms. In one or more examples, the second energy state may be higher than the first energy state. In one or more examples, the second energy state may be an intermediate energy state between the ground state and a high-energy Rydberg state.

In one or more examples, method 500 may comprise a step 504, which may comprise generating using a second laser, a second laser signal that is configured to excite one or more atoms in the atomic vapor cell from the second energy state to a third energy state. Optionally, step 504 may be executed simultaneously with step 502. Optionally, step 504 may be executed after step 502. In one or more examples, the second laser may have one or more features of control laser 404 shown in FIG. 4. In one or more examples, the second laser signal generated by the second laser may have one or more features of control laser signal 408 shown in FIG. 4. In one or more examples, the third energy state may be higher than the second energy state. In one or more examples, the third energy state may be a high-energy Rydberg state.

After the first laser signal has been generated using the first laser in step 502, method 500 may proceed from step 502 to a step 506, wherein the first laser signal may be split into a first polarized signal and a second polarized signal using a first beam displacer. In one or more examples, and at step 506, the first laser signal may be split into any number of polarized signals, however for the purposes of illustration the method 500 is described with a first polarized signal and a second polarized signal, but the example provided should not be seen as limiting to the disclosure. In one or more examples, the first beam displacer may include one or more features of first beam displacer 410 shown in FIG. 4. In one or more examples, the first polarized signal may include one or more features of first polarized signal 416 shown in FIG. 4. In one or more examples, the second polarized signal may include one or more features of second polarized signal 418 shown in FIG. 4. In one or more examples, the first polarized signal may be polarized orthogonally to the second polarized signal.

Likewise, after the second laser signal has been generated using the second laser in step 504, method 500 may proceed from step 504 to a step 508, wherein the second laser signal may be split into a third polarized signal and a fourth polarized signal using a second beam displacer. In one or more examples, and at step 508, the second laser signal may be split into any number of polarized signals, however for the purposes of illustration the method 500 is described with a third polarized signal and a fourth polarized signal, but the example provided should not be seen as limiting to the disclosure. In one or more examples, the second beam displacer may include one or more features of second beam displacer 412 shown in FIG. 4. In one or more examples, the third polarized signal may include one or more features of third polarized signal 420 shown in FIG. 4. In one or more examples, the fourth polarized signal may include one or more features of fourth polarized signal 422 shown in FIG. 4. In one or more examples, the third polarized signal may be polarized orthogonally with respect to the fourth polarized signal. In one or more examples, the third polarized signal may be polarized parallel with respect to the first polarized signal and the fourth polarized signal may be polarized in parallel with respect to the second polarized signal. Optionally, step 508 may be executed concurrently with step 506.

Following the splitting of the first laser signal into the first and second polarized signals in step 506 and the splitting of the second laser signal into the third and fourth polarized signals in step 508, method 500 may proceed to a step 510, wherein the first beam displacer and the second beam displacer may transmit the first polarized signal and the third polarized signal, respectively, through the atomic vapor cell such that the first and third signals counter-propagate through a first region of the vapor cell. As the first and third polarized signals counter-propagate through the first region, they may excite atoms in the first region from the first energy state to the third energy state. In one or more examples, method 500 may simultaneously proceed to a step 512, wherein the first beam displacer and the second beam displacer may transmit the second polarized signal and the fourth polarized signal, respectively, through the atomic vapor cell such that the second and fourth signals counter-propagate through a second region of the vapor cell. As the second and fourth polarized signals counter-propagate through the second region, they may excite atoms in the second region from the first energy state to the third energy state. In one or more examples, the first region may include one or more features of first excitation region 430 shown in FIG. 4. In one or more examples, the second region may include one or more features of second excitation region 432 shown in FIG. 4.

In one or more examples, when the atoms in each region are excited to the third energy state, they may be highly sensitive to incident electric fields. Specifically, when the atoms are excited to the third energy state and exposed to an incident electric field, perturbations of the atoms' energies may be induced by the electric field. These perturbations may induce an optical response in the laser signals that are propagating through the atomic vapor cell. In one or more examples, as mentioned above, the first polarized signal and the third polarized signal may have parallel polarizations. Similarly, in one or more examples, the second polarized signal and the fourth polarized signal may have parallel polarizations. Additionally, in one or more examples, the polarizations of the second/fourth signals may be different from the polarizations of the first/third signals. Thus, in one or more examples, the atoms in the first region may be excited from the first energy state to the third energy state by signals having one polarization (the polarization of the first/third polarized signals) while the atoms in the second region may be excited from the first energy state to the third energy state by signals having a different polarization (the polarization of the second/fourth signals). In one or more examples, incident electric fields having polarization components that are large in amplitude and parallel to the polarizations of the signals in a particular vapor cell region may induce a stronger optical response in that region. For example, if an incident electric field is primarily polarized in a direction that is parallel to the first/third polarized signals, the optical responses of the signals in the first region may be stronger than the optical responses of the signals in the second region, because the energy levels of the excited atoms in the first region may be more significantly impacted by the incident field than the energy levels of the excited atoms in the second region.

In one or more examples, the angle of arrival of the incident electric field on the atomic vapor cell may also affect the optical behavior and properties of the laser signals propagating through each region in the vapor cell. In one or more examples, the incident electric field may induce one or more phase shifts in the signals propagating through the first region or the second region. In one or more examples, the phase shifts may be relative to a known reference signal (e.g., reference signal 438 shown in FIG. 4).

In one or more examples, after the first/third polarized signals have been transmitted through the first region of the atomic vapor cell in step 510 and the second/fourth polarized signals have been transmitted through the second region of the atomic vapor cell in step 512, method 500 may proceed to a step 514, wherein one or more photodetectors may receive the first and second polarized signals as they exit the atomic vapor cell. In one or more examples, the one or more photodetectors may include features of photodetectors 440 shown in FIG. 4.

Following the receipt of the first and second polarized signals by the one or more photodetectors in step 514, method 500 may proceed to step 516, wherein an angle of arrival of and polarization information associated with the incident electric field may be determined. In one or more examples, this vector and polarization information may be determined by one or more processors of a Rydberg atom electric field sensor, such as processors 442 shown in FIG. 4.

In one or more examples, the angle of arrival may be determined based on one or more signals received from the one or more photodetectors that received the first and second polarized signals from the atomic vapor cell in step 512. An exemplary technique for determining the angle of arrival based on the one or more signals from the one or more photodetectors is discussed below with respect to FIG. 6.

In one or more examples, the polarization information, which may comprise a relative amplitude of a first polarization component and a second polarization component of the electric field, may be determined based on the one or more signals received from the photodetectors that received the first and second polarized signals from the atomic vapor cell in step 512. For additional discussion of the determination of the polarization information, see the description of FIG. 7.

Figure 6:
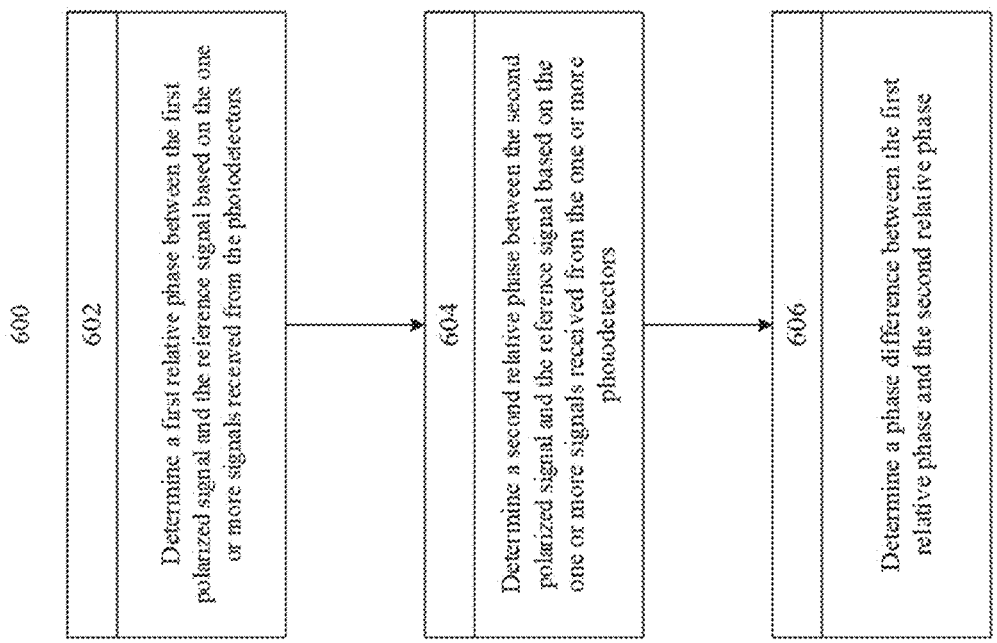
FIG. 6 illustrates an exemplary method for determining an angle of arrival of an electric field according to examples of the present disclosure.

As mentioned above, FIG. 6 illustrates an exemplary method for determining an angle of arrival of an electric field according to examples of the present disclosure. Specifically, FIG. 6 shows a method 600 for determining an angle of arrival of an electric field using a Rydberg atom electric field sensor such as sensor 400 shown in FIG. 4. In one or more examples, method 600 may be executed by one or more processors of a Rydberg atom electric field sensor (e.g., processors 442 shown in FIG. 4).

In one or more examples, method 600 may be executed during a method for determining vector and polarization information associated with an electric field such as method 500 shown in FIG. 5. Specifically, in one or more examples, method 600 may be executed after the processors of the Rydberg atom electric field sensor have received one or more signals from one or more photodetectors associated with responses of atoms in one or more regions of an atomic vapor cell to the electric field. For instance, in one or more examples, method 600 may be executed during step 512 of method 500.

In one or more examples, method 600 may comprise a step 602, wherein the Rydberg atom electric field sensor's processors may determine a first relative phase between a first polarized signal and a reference signal based on the one or more signals received from the photodetectors. In one or more examples, the first polarized signal may be a signal generated from a laser configured to excite atoms in an atomic vapor cell from a first energy state to a second energy state (e.g., from a ground state to an intermediate state that is higher than the ground state and lower than a high-energy Rydberg state). In one or more examples, the reference signal may be a signal with a known phase that was generated by an oscillator. In one or more examples, the reference signal may include one or more features of reference signal 438 shown in FIG. 4.

After determining the first relative phase between the first polarized signal and the reference signal in step 602, method 600 may proceed to a step 604, wherein the processors may determine a second relative phase between a second polarized signal and the reference signal based on the one or more signals received from the one or more photodetectors. In one or more examples, the second polarized signal may be a signal generated from a laser configured to excite atoms in the atomic vapor cell from the first energy state to the second energy state. In one or more examples, the second polarized signal may have a different polarization than the first polarized signal.

Following the determination of the first relative phase in step 602 and the second relative phase in step 604, method 600 may move to a step 606, wherein the processors may determine a phase difference between the first relative phase and the second relative phase. In one or more examples, the angle of arrival of the electric field may be determined based on the phase difference. For a detailed description of the determination of the angle of arrival, see the description of FIG. 4.

Figure 7:
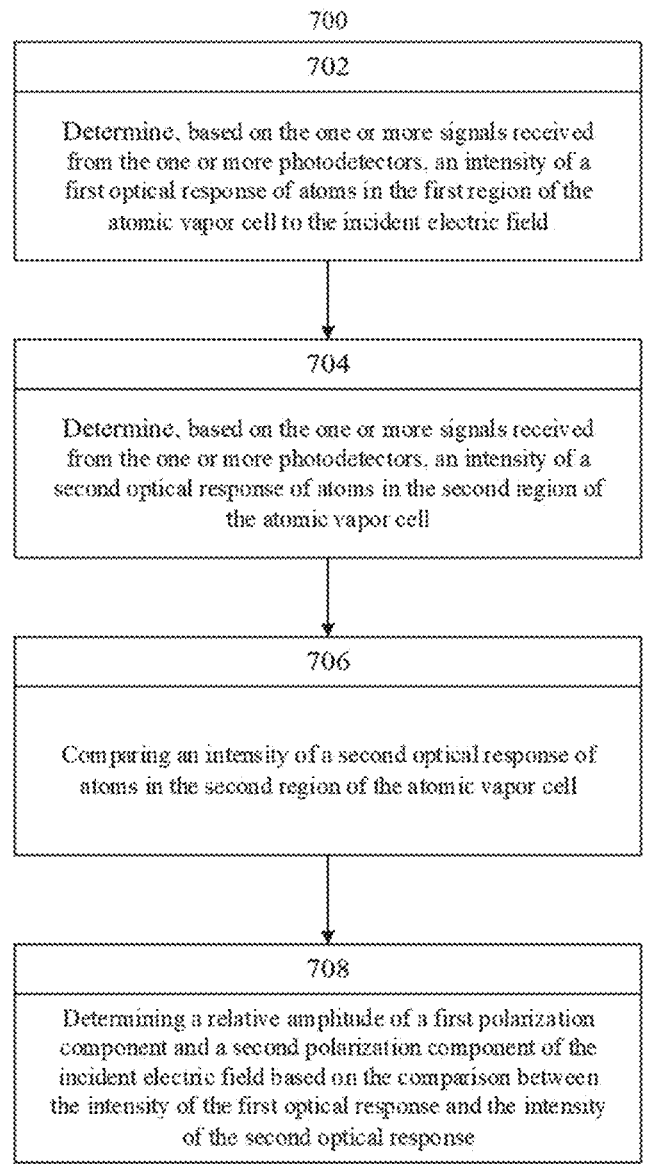
FIG. 7 illustrates an exemplary method for determining polarization information associated with an electric field according to examples of the present disclosure.

FIG. 7 illustrates an exemplary method for determining polarization information associated with an electric field according to examples of the present disclosure. Specifically, FIG. 7 shows a method 700 for determining polarization information associated with an incident electric field using a Rydberg atom electric field sensor such as sensor 400 shown in FIG. 4. In one or more examples, method 700 may be executed by one or more processors of a Rydberg atom electric field sensor (e.g., processors 442 shown in FIG. 4).

In one or more examples, method 700 may be executed during a method for determining vector and polarization information associated with an electric field such as method 500 shown in FIG. 5. Specifically, in one or more examples, method 700 may be executed after the processors of the Rydberg atom electric field sensor have received one or more signals from one or more photodetectors associated with responses of atoms in one or more regions of an atomic vapor cell to the electric field. For instance, in one or more examples, method 700 may be executed during step 512 of method 500.

In one or more examples, method 700 may comprise a step 702, wherein the sensor's processors may determine an intensity of a first optical response of atoms in a first region of an atomic vapor cell to the incident electric field. In one or more examples, the first region of the atomic vapor cell may have one or more features of first excitation region 430 shown in FIG. 4. In one or more examples, the atoms in the first excitation region may have been excited from a first energy state to a third energy state by signals having a first polarization.

Following the determination of the first optical response in step 701, method 700 may move to a step 704, wherein the sensor's processors may determine an intensity of a second optical response of atoms in a second region of the atomic vapor cell to the incident electric field. In one or more examples, the second region of the atomic vapor cell may have one or more features of second excitation region 432 shown in FIG. 4. In one or more examples, the atoms in the second excitation region may have been excited from a first energy state to a third energy state by signals having a second polarization that is different from the first polarization.

In one or more examples, after the first and second optical responses are determined in steps 702 and 704, method 700 may proceed to a step 706, wherein an intensity of the first optical response may be compared to an intensity of the second optical response. The ratio of the intensities transmitted through regions 430 and 432 will depend on the relative strength of the polarization components of field 446. The ratio of the intensity of the field transmitted through region 430 to that of the field transmitted through region 432 may follow the following trend: $[1-(E_{\|,430}/|\vec{E}|)^2]/[1-(E_{\|,432}/|\vec{E}|)^2]$, where $E_{\|,430}$ is the component of the total field 446 ($|\vec{E}|$) whose polarization is parallel to fields 416 and 420, and $E_{\|,432}$ is the component of the total field 446 whose polarization is parallel to fields 424 and 422. Based on the results of the comparison in step 706, method 700 may move to a step 708, wherein the processors may determine a relative amplitude of a first polarization component and a second polarization component of the incident electric field based on the comparison between the intensity of the first optical response and the intensity of the second optical response. In one or more examples, if the amplitude of the first polarization component is relatively larger than that of the second component, the polarization of the incident electric field may be more closely aligned with the polarizations of the laser signals propagating through the first region of the atomic vapor cell. In one or more examples, if the amplitude of the second polarization component is relatively larger than that of the first component, the polarization of the incident electric field may be more closely aligned with the polarizations of the laser signals propagating through the second region of the atomic vapor cell.

Computer Systems

Figure 8:
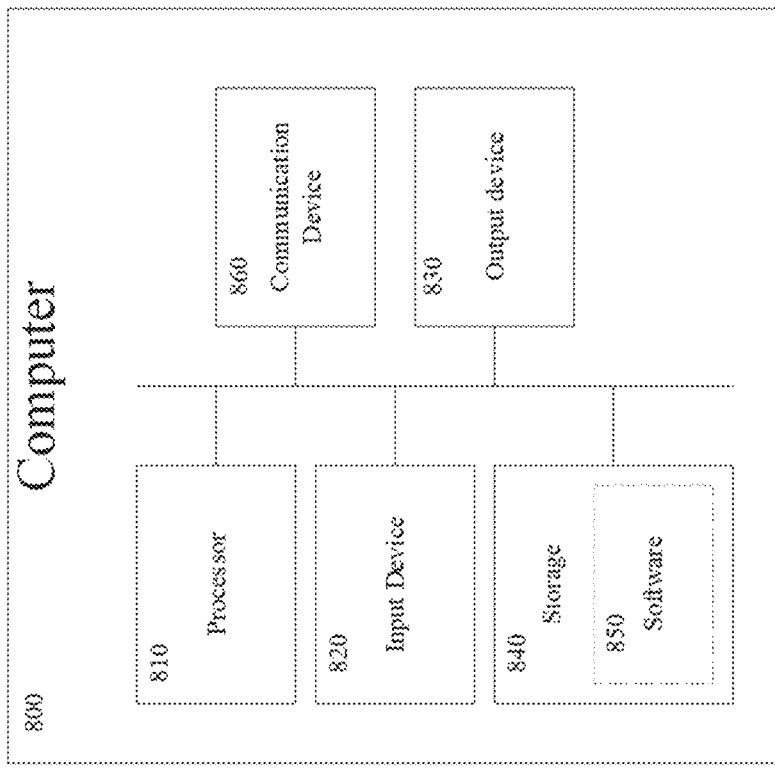
FIG. 8 illustrates an exemplary computing system according to examples of the present disclosure.

In one or more examples, a Rydberg atom electric field sensor may comprise a computer configured to control one or more features of the sensor. FIG. 8 illustrates an exemplary computing system according to examples of the disclosure. In one or more examples, computer 800 may be involved in executing one or more of the methods described herein, such as self-locking method 500 shown in FIG. 5. Computer 800 can be a host computer connected to a network. Computer 800 can be a client computer or a server. As shown in FIG. 8, computer 800 can be any suitable type of microprocessor-based device, such as a personal computer, workstation, server, or handheld computing device, such as a phone or tablet. The computer can include, for example, one or more of processor 810, input device 820, output device 830, storage 840, and communication device 860. Input device 820 and output device 830 can correspond to those described above and can either be connectable or integrated with the computer.

Input device 820 can be any suitable device that provides input, such as a touch screen or monitor, keyboard, mouse, or voice-recognition device. Output device 830 can be any suitable device that provides an output, such as a touch screen, monitor, printer, disk drive, or speaker.

Storage 840 can be any suitable device that provides storage, such as an electrical, magnetic, or optical memory, including a random access memory (RAM), cache, hard drive, CD-ROM drive, tape drive, or removable storage disk. Communication device 860 can include any suitable device capable of transmitting and receiving signals over a network, such as a network interface chip or card. The components of the computer can be connected in any suitable manner, such as via a physical bus or wirelessly. Storage 840 can be a non-transitory computer-readable storage medium comprising one or more programs, which, when executed by one or more processors, such as processor 810, cause the one or more processors to execute methods described herein.

Software 850, which can be stored in storage 840 and executed by processor 810, can include, for example, the programming that embodies the functionality of the present disclosure (e.g., as embodied in the systems, computers, servers, and/or devices as described above). In one or more examples, software 850 can include a combination of servers such as application servers and database servers.

Software 850 can also be stored and/or transported within any computer-readable storage medium for use by or in connection with an instruction execution system, apparatus, or device, such as those described above, that can fetch and execute instructions associated with the software from the instruction execution system, apparatus, or device. In the context of this disclosure, a computer-readable storage medium can be any medium, such as storage 840, that can contain or store programming for use by or in connection with an instruction execution system, apparatus, or device.

Software 850 can also be propagated within any transport medium for use by or in connection with an instruction execution system, apparatus, or device, such as those described above, that can fetch and execute instructions associated with the software from the instruction execution system, apparatus, or device. In the context of this disclosure, a transport medium can be any medium that can communicate, propagate, or transport programming for use by or in connection with an instruction execution system, apparatus, or device. The transport-readable medium can include but is not limited to, an electronic, magnetic, optical, electromagnetic, or infrared wired or wireless propagation medium.

Computer 800 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Computer 800 can implement any operating system suitable for operating on the network. Software 850 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

CONCLUSION

The foregoing description, for the purpose of explanation, has been described with reference to specific embodiments and/or examples. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims. Finally, the entire disclosure of the patents and publications referred to in this application are hereby incorporated herein by reference.

Any of the systems, methods, techniques, and/or features disclosed herein may be combined, in whole or in part, with any other systems, methods, techniques, and/or features disclosed herein.

The invention claimed is:

1. An electric field sensor comprising:
   an atomic vapor cell configured to contain one or more atoms;
   a first laser, wherein the first laser generates a first laser signal configured to excite the one or more atoms in the atomic vapor cell from a first energy state to a second energy state, and wherein the second energy state is higher than the first energy state;
   a second laser, wherein the second laser generates a second laser signal configured to excite the one or more atoms in the in atomic vapor cell from the second energy state to a third state, and wherein the third energy state is higher than the second energy state;
   a first beam displacer, wherein the first beam displacer is configured to receive the first laser signal from the first laser, wherein the first beam displacer is configured to split the first laser signal into a first polarized signal and a second polarized signal, and wherein the first beam displacer is optically connected to the atomic vapor cell and is configured to transmit the first and second polarized signals to the atomic vapor cell;
   a second beam displacer, wherein the second beam displacer is configured to receive the second laser signal from the second laser, wherein the second beam displacer is configured to split the second laser into a third polarized and a fourth polarized signal, wherein the second beam displacer is optically connected to the atomic vapor cell and is configured to transmit the third and fourth polarized signals to the atomic vapor cell, wherein the first and third polarized signals are transmitted to the atomic vapor cell such that they counter-propagate in a first region of the atomic vapor cell, and wherein the second and fourth polarized signals are transmitted to the atomic vapor cell such that they counter-propagate in a second region of the atomic vapor cell;
   one or more photodetectors configured to receive the first and second polarized signals as they exit the atomic vapor cell;
   a memory; and
   one or more processors;
   wherein the memory stores one or more programs that when executed by the one or more processors, cause the one or more processors, when an electric field is incident upon the atomic vapor cell, to:
      determine an angle of arrival of the electric field based on one or more signals received from the one or more photodetectors; and
      determine polarization information associated with the electric field based on the one or more signals received from the one or more photodetectors.

2. The electric field sensor of claim 1, wherein the one or more atoms comprise one or more rubidium atoms.

3. The electric field sensor of claim 1, wherein the first polarized signal is polarized orthogonally to the second polarized signal.

4. The electric field sensor of claim 1, wherein the third polarized signal is polarized orthogonally to the fourth polarized signal.

5. The electric field sensor of claim 1, wherein the first polarized signal and the third polarized signal have the same polarization.

6. The electric field sensor of claim 1, wherein the second polarized signal and the fourth polarized signal have the same polarization.

7. The electric field sensor of claim 1, wherein the first laser signal has a wavelength greater than or equal to 750 nm and less than or equal to 800 nm.

8. The electric field sensor of claim 1, wherein the second laser signal has a wavelength greater than or equal to 425 nm and less than or equal to 475 nm.

9. The electric field sensor of claim 1, wherein the one or more photodetectors comprise one or more photodiodes.

10. The electric field sensor of claim 1, wherein the sensor comprises an oscillator configured to transmit a reference signal to the atomic vapor cell, and wherein the reference signal is configured to propagate through the first region and the second region of the atomic vapor cell.

11. The electric field sensor of claim 10, wherein determining the angle of arrival of the electric field comprises:
    determining a first relative phase between the first polarized signal and the reference signal;
    determining a second relative phase between second polarized signal and the reference signal; and
    determining a phase difference between the first relative phase and the second relative phase.

12. The electric field sensor of claim 10, wherein determining the polarization information associated with the electric field comprises:
    determining an intensity of a first optical response of atoms in the first region of the atomic vapor cell due to the incident electric field;

determining an intensity of a second optical response of atoms in the second region of the atomic vapor cell due to the incident electric field;

comparing the intensity of a first optical response of atoms in the first region of the atomic vapor cell to the intensity of a second optical response of atoms in the second region of the atomic vapor cell; and determining a relative amplitude of a first polarization component and a second polarization component of the incident electric field based on the comparison between the intensity of the first optical response and the intensity of the second optical response.

13. The electric field sensor of claim 12, wherein the first polarization component of the incident electric field is parallel to the first polarized signal and the second polarization component of the incident electric field is parallel to the second polarized signal.

14. A method for detecting an electric field, the method comprising:

generating, using a first laser, a first laser signal configured to excite one or more atoms in an atomic vapor cell from a first energy state to a second energy state, wherein the second energy state is higher than the first energy state;

generating, using a second laser, a second laser signal configured to excite the one or more atoms in the in atomic vapor cell from the second energy state to a third state, wherein the third energy state is higher than the second energy state;

using a first beam displacer, splitting the first laser signal into a first polarized signal and a second polarized signal;

using a second beam displacer, splitting the second laser signal into a third polarized signal and a fourth polarized signal;

transmitting the first polarized signal from the first beam displacer to the atomic vapor cell and the third polarized signal from the second beam displacer to the atomic vapor cell such that the first polarized signal and the third polarized signal counter-propagate in a first region of the atomic vapor cell;

transmitting the second polarized signal from the first beam displacer to the atomic vapor cell and the fourth polarized signal from the second beam displacer to the atomic vapor cell such that the second polarized signal and the fourth polarized signal counter-propagate in a second region of the atomic vapor cell;

receiving, at one or more photodetectors, the first and second polarized signals as they exit the atomic vapor cell; and when an electric field is incident upon the atomic vapor cell, using one or more processors to:

determine an angle of arrival of the electric field based on one or more signals received from the one or more photodetectors; and determine polarization information associated with the electric field based on the one or more signals received from the one or more photodetectors.

15. The method of claim 14, wherein the one or more atoms comprise one or more rubidium atoms.

16. The method of claim 14, wherein the first polarized signal is polarized orthogonally to the second polarized signal.

17. The method of claim 14 wherein the third polarized signal is polarized orthogonally to the fourth polarized signal.

18. The method of claim 14, wherein the first polarized signal and the third polarized signal have the same polarization.

19. The method of claim 14, wherein the second polarized signal and the fourth polarized signal have the same polarization.

20. The method of claim 14, wherein the first laser signal has a wavelength greater than or equal to 750 nm and less than or equal to 800 nm.

21. The method of claim 14, wherein the second laser signal has a wavelength greater than or equal to 425 nm and less than or equal to 475 nm.

22. The method of claim 14, wherein the one or more photodetectors comprise one or more photodiodes.

23. The method of claim 14, wherein the sensor comprises an oscillator configured to transmit a reference signal to the atomic vapor cell, and wherein the reference signal is configured to propagate through the first region and the second region of the atomic vapor cell.

24. The method of claim 23, wherein determining the angle of arrival of the electric field comprises:

determining a first relative phase between the first polarized signal and the reference signal;

determining a second relative phase between second polarized signal and the reference signal; and determining a phase difference between the first relative phase and the second relative phase.

25. The method of claim 23, wherein determining the polarization information associated with the electric field comprises:

determining an intensity of a first optical response of atoms in the first region of the atomic vapor cell due to the incident electric field;

determining an intensity of a second optical response of atoms in the second region of the atomic vapor cell due to the incident electric field;

comparing the intensity of a first optical response of atoms in the first region of the atomic vapor cell to the intensity of a second optical response of atoms in the second region of the atomic vapor cell; and determining a relative amplitude of a first polarization component and a second polarization component of the incident electric field based on the comparison between the intensity of the first optical response and the intensity of the second optical response.

26. The method of claim 25, wherein the first polarization component of the incident electric field is parallel to the first polarized signal and the second polarization component of the incident electric field is parallel to the second polarized signal.

27. A non-transitory computer readable storage medium storing instructions for detecting an electric field that, when executed by one or more processors of an electronic device, cause the device to:

generate, using a first laser, a first laser signal configured to excite one or more atoms in an atomic vapor cell from a first energy state to a second energy state, wherein the second energy state is higher than the first energy state;

generate, using a second laser, a second laser signal configured to excite the one or more atoms in the in atomic vapor cell from the second energy state to a third state, wherein the third energy state is higher than the second energy state;

using a first beam displacer, split the first laser signal into a first polarized signal and a second polarized signal;

using a second beam displacer, split the second laser signal into a third polarized signal and a fourth polarized signal;

transmit the first polarized signal from the first beam displacer to the atomic vapor cell and the third polarized signal from the second beam displacer to the atomic vapor cell such that the first polarized signal and the third polarized signal counter-propagate in a first region of the atomic vapor cell;

transmit the second polarized signal from the first beam displacer to the atomic vapor cell and the fourth polarized signal from the second beam displacer to the atomic vapor cell such that the second polarized signal and the fourth polarized signal counter-propagate in a second region of the atomic vapor cell;

receive, at one or more photodetectors, the first and second polarized signals as they exit the atomic vapor cell; and when an electric field is incident upon the atomic vapor cell:
  determine an angle of arrival of the electric field based on one or more signals received from the one or more photodetectors; and
  determine polarization information associated with the electric field based on the one or more signals received from the one or more photodetectors.

28. The non-transitory computer readable storage medium of claim 27, wherein the one or more atoms comprise one or more rubidium atoms.

29. The non-transitory computer readable storage medium of claim 27, wherein the first polarized signal is polarized orthogonally to the second polarized signal.

30. The non-transitory computer readable storage medium of claim 27, wherein the third polarized signal is polarized orthogonally to the fourth polarized signal.

31. The non-transitory computer readable storage medium of claim 27, wherein the first polarized signal and the third polarized signal have the same polarization.

32. The non-transitory computer readable storage medium of claim 27, wherein the second polarized signal and the fourth polarized signal have the same polarization.

33. The non-transitory computer readable storage medium of claim 27, wherein the first laser signal has a wavelength greater than or equal to 750 nm and less than or equal to 800 nm.

34. The non-transitory computer readable storage medium of claim 27, wherein the second laser signal has a wavelength greater than or equal to 425 nm and less than or equal to 475 nm.

35. The non-transitory computer readable storage medium of claim 27, wherein the one or more photodetectors comprise one or more photodiodes.

36. The non-transitory computer readable storage medium of claim 27, wherein the sensor comprises an oscillator configured to transmit a reference signal to the atomic vapor cell, and wherein the reference signal is configured to propagate through the first region and the second region of the atomic vapor cell.

37. The non-transitory computer readable storage medium of claim 36, wherein determining the angle of arrival of the electric field comprises:
  determining a first relative phase between the first polarized signal and the reference signal;
  determining a second relative phase between second polarized signal and the reference signal; and
  determining a phase difference between the first relative phase and the second relative phase.

38. The non-transitory computer readable storage medium of claim 36, wherein determining the polarization information associated with the electric field comprises:
  determining an intensity of a first optical response of atoms in the first region of the atomic vapor cell due to the incident electric field;
  determining an intensity of a second optical response of atoms in the second region of the atomic vapor cell due to the incident electric field;
  comparing the intensity of a first optical response of atoms in the first region of the atomic vapor cell to the intensity of a second optical response of atoms in the second region of the atomic vapor cell; and
  determining a relative amplitude of a first polarization component and a second polarization component of the incident electric field based on the comparison between the intensity of the first optical response and the intensity of the second optical response.

39. The non-transitory computer readable storage medium of claim 38, wherein the first polarization component of the incident electric field is parallel to the first polarized signal and the second polarization component of the incident electric field is parallel to the second polarized signal.

* * * * *